(12) United States Patent
Cudak et al.

(10) Patent No.: US 8,897,074 B2
(45) Date of Patent: Nov. 25, 2014

(54) WRITING DATA TO A THERMALLY SENSITIVE MEMORY DEVICE

(71) Applicant: International Business Machines Corporation, Armonk, NY (US)

(72) Inventors: Gary D. Cudak, Creedmoor, NC (US); Lydia M. Do, Raleigh, NC (US); Christopher J. Hardee, Raleigh, NC (US); Adam Roberts, Moncure, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/791,068

(22) Filed: Mar. 8, 2013

(65) Prior Publication Data

US 2014/0254278 A1    Sep. 11, 2014

(51) Int. Cl.
*G11C 11/34* (2006.01)
*G11C 16/04* (2006.01)

(52) U.S. Cl.
CPC .................................. *G11C 16/04* (2013.01)
USPC ............ 365/185.18; 365/185.11; 365/185.23; 365/185.33; 365/189.011; 365/230.01; 365/230.03

(58) Field of Classification Search
USPC ............. 365/185.11, 185.18, 185.23, 185.33, 365/189.011, 230.01, 230.03
See application file for complete search history.

(56) References Cited

U.S. PATENT DOCUMENTS

| 7,773,413 B2 | 8/2010 | Shalvi |
| 2009/0161464 A1 | 6/2009 | Midorikawa et al. |
| 2010/0153628 A1 | 6/2010 | Jang et al. |
| 2012/0106243 A1 | 5/2012 | Lym et al. |
| 2012/0124590 A1* | 5/2012 | Balakrishnan et al. ....... 718/103 |
| 2012/0275235 A1 | 11/2012 | Parker |
| 2012/0287692 A1* | 11/2012 | Rotbard et al. ................. 365/45 |
| 2013/0128682 A1* | 5/2013 | Henderson et al. ........... 365/222 |
| 2014/0103545 A1* | 4/2014 | Lee et al. ...................... 257/786 |

FOREIGN PATENT DOCUMENTS

| CN | 101751978 A | 6/2010 |
| EP | 2 498 259 A2 | 9/2012 |
| KR | 20080071366 A | 8/2008 |
| WO | WO 2010/000206 A1 | 1/2010 |

OTHER PUBLICATIONS

Seung, J., et al., "High Speed and Nonvolatile Si Nanocrystal Memory for Scaled Flash Technology using Highly Field-Sensitive Tunnel Barrier", IEEE International Electron Devices Meeting, 2003, IEDM '03 Technical Digest, pp. 22.3.1-22.3.4, Dec. 8-10, 2003, IEEE Conference Publications. DOI: 10.1109/IEDM.2003.1269341 URL: http://ieeexplore.ieee.org/stamp/stamp.jsp?tp=&arnumber=1269341&isnumber=28396.

(Continued)

*Primary Examiner* — Fernando Hidalgo
(74) *Attorney, Agent, or Firm* — Edward J. Lenart; Katherine S. Brown; Biggers Kennedy Lenart Spraggins LLP

(57) ABSTRACT

Writing data to a thermally sensitive memory device, including: receiving a physical layout of the thermally sensitive memory device; receiving the direction of airflow across the thermally sensitive memory device; selecting an address for writing data to the thermally sensitive memory device in dependence upon the physical layout of the thermally sensitive memory device and the direction of airflow across the thermally sensitive memory device; and writing data to the selected address of the thermally sensitive memory device.

12 Claims, 6 Drawing Sheets

(56) References Cited

OTHER PUBLICATIONS

Yinglei, W., et al., "Flash Memory for Ubiquitous Hardware Security Functions: True Random Number Generation and Device Fingerprints", 2012 IEEE Symposium on Security and Privacy (SP), pp. 33-47, May 20-23, 2012, IEEE Conference Publications. DOI: 10.1109/SP.2012.12 URL: http://ieeexplore.ieee.org/stamp/stamp.jsp?tp=&arnumber=6234403&isnumber=6234400.

* cited by examiner

WRITING DATA TO A THERMALLY SENSITIVE MEMORY DEVICE

BACKGROUND OF THE INVENTION

1. Field of the Invention

The field of the invention is data processing, or, more specifically, methods, apparatus, and products for writing data to a thermally sensitive memory device.

2. Description of Related Art

Modern computing systems can include computing components whose performance is degraded by the introduction of heat. Many times such computing components actually generate heat themselves. Any example of such a computing component is a memory device that includes flash memory. Flash memory not only produces heat during operation, but is also sensitive to heat.

SUMMARY OF THE INVENTION

Methods, apparatuses, and products for writing data to a thermally sensitive memory device, including: receiving a physical layout of the thermally sensitive memory device; receiving the direction of airflow across the thermally sensitive memory device; selecting, an address for writing data to the thermally sensitive memory device in dependence upon the physical layout of the thermally sensitive memory device and the direction of airflow across the thermally sensitive memory device; and writing data to the selected address of the thermally sensitive memory device.

The foregoing and other objects, features and advantages of the invention will be apparent from the following more particular descriptions of example embodiments of the invention as illustrated in the accompanying drawings wherein like reference numbers generally represent like parts of example embodiments of the invention.

DETAILED DESCRIPTION OF EXAMPLE EMBODIMENTS

Figure 1:
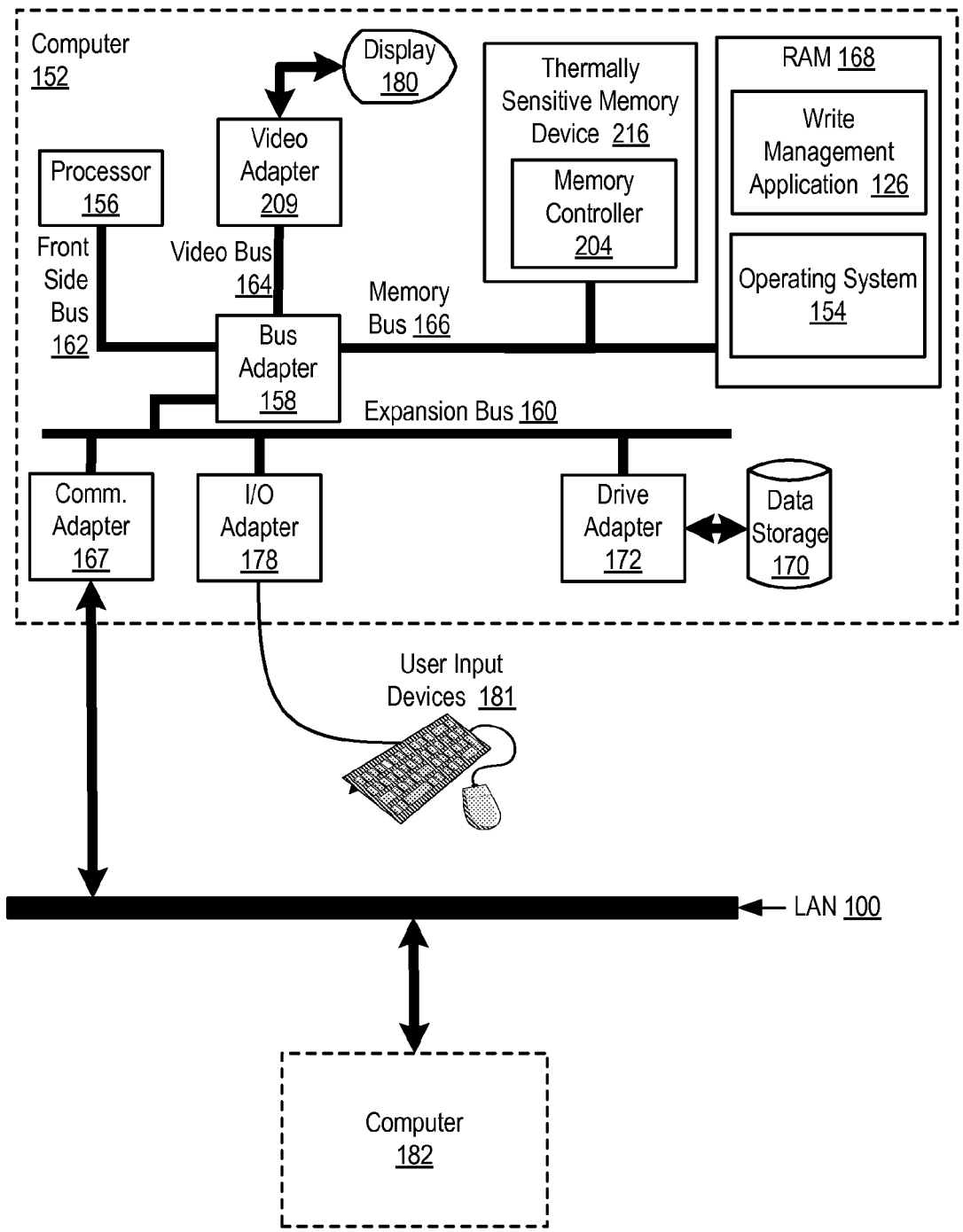
FIG. 1 sets forth a block diagram of automated computing machinery comprising an example computer useful in writing data to a thermally sensitive memory device according to embodiments of the present invention.

Example methods, apparatus, and products for writing data to a thermally sensitive memory device in accordance with the present invention are described with reference to the accompanying drawings, beginning with FIG. 1. FIG. 1 sets forth a block diagram of automated computing machinery comprising an example computer (152) useful in writing data to a thermally sensitive memory device (216) according to embodiments of the present invention.

The example computer (152) of FIG. 1 includes a thermally sensitive memory device (216). The thermally sensitive memory device (216) of may include a plurality of memory modules, such as flash memory modules. Flash memory is an electronic non-volatile computer storage device that can be electrically erased and reprogrammed. Because flash memory is an electronic storage device, flash memory does not include moving parts such as a read head and therefore offers relatively fast access.

The thermally sensitive memory device (216) also includes a memory controller (204). The memory controller (204) may be embodied as a digital circuit that manages the flow of data going to and from the memory modules in the thermally sensitive memory device (216). The memory controller (204) may write data to memory modules and may also read data from the memory modules. Although not illustrated in FIG. 1, the computer (152) may also include cooling elements such as a fan for cooling components of the thermally sensitive memory device (216). Such a cooling element can generate airflow that passes over the thermally sensitive memory device (216) to remove heat from the thermally sensitive memory device (216).

The memory controller (204) of FIG. 1 can be useful in writing data to the thermally sensitive memory device (216) according to embodiments of the present invention by receiving a physical layout of the thermally sensitive memory device (216), receiving the direction of airflow across the thermally sensitive memory device (216), selecting an address for writing data to the thermally sensitive memory device (216) in dependence upon the physical layout of the thermally sensitive memory device (216) and the direction of airflow across the thermally sensitive memory device (216), and writing data to the selected address of the thermally sensitive memory device (216).

The computer (152) of FIG. 1 includes at least one computer processor (156) or 'CPU' as well as random access memory (168) ('RAM') which is connected through a high speed memory bus (166) and bus adapter (158) to processor (156) and to other components of the computer (152). Stored in RAM (168) is a write management module (126), a module of computer program instructions useful for writing data to a thermally sensitive memory device (216) according to embodiments of the present invention. The write management module (126) may include computer program instructions for analyzing the physical layout of the thermally sensitive memory device (216), analyzing the direction of airflow across the thermally sensitive memory device (216), and determining how to write data to the thermally sensitive memory device (216) in a way so as to minimize the impact of heat generated during such write operations on the performance of the thermally sensitive memory device (216). In such an example, the write management module (126) can generate tables and other data structures to be loaded onto the memory controller (204) for assisting the memory controller (204) in writing data to a thermally sensitive memory device (216) according to embodiments of the present invention.

Also stored in RAM (168) is an operating system (154). Operating systems useful writing data to a thermally sensitive memory device (216) according to embodiments of the present invention include UNIX™, Linux™, Microsoft XP™, AIX™, IBM's i5/OS™, and others as will occur to those of skill in the art. The operating system (154) in the example of FIG. 1 is shown in RAM (168), but many components of such software typically are stored in non-volatile memory also, such as, for example, on a disk drive (170).

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers for writing data to a thermally sensitive memory device (216) according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The example computer (152) of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for writing data to a thermally sensitive memory device (216) according to embodiments of the present invention include modems for wired dial-up communications, Ethernet (IEEE 802.3) adapters for wired data communications network communications, and 802.11 adapters for wireless data communications network communications.

Figure 2A:
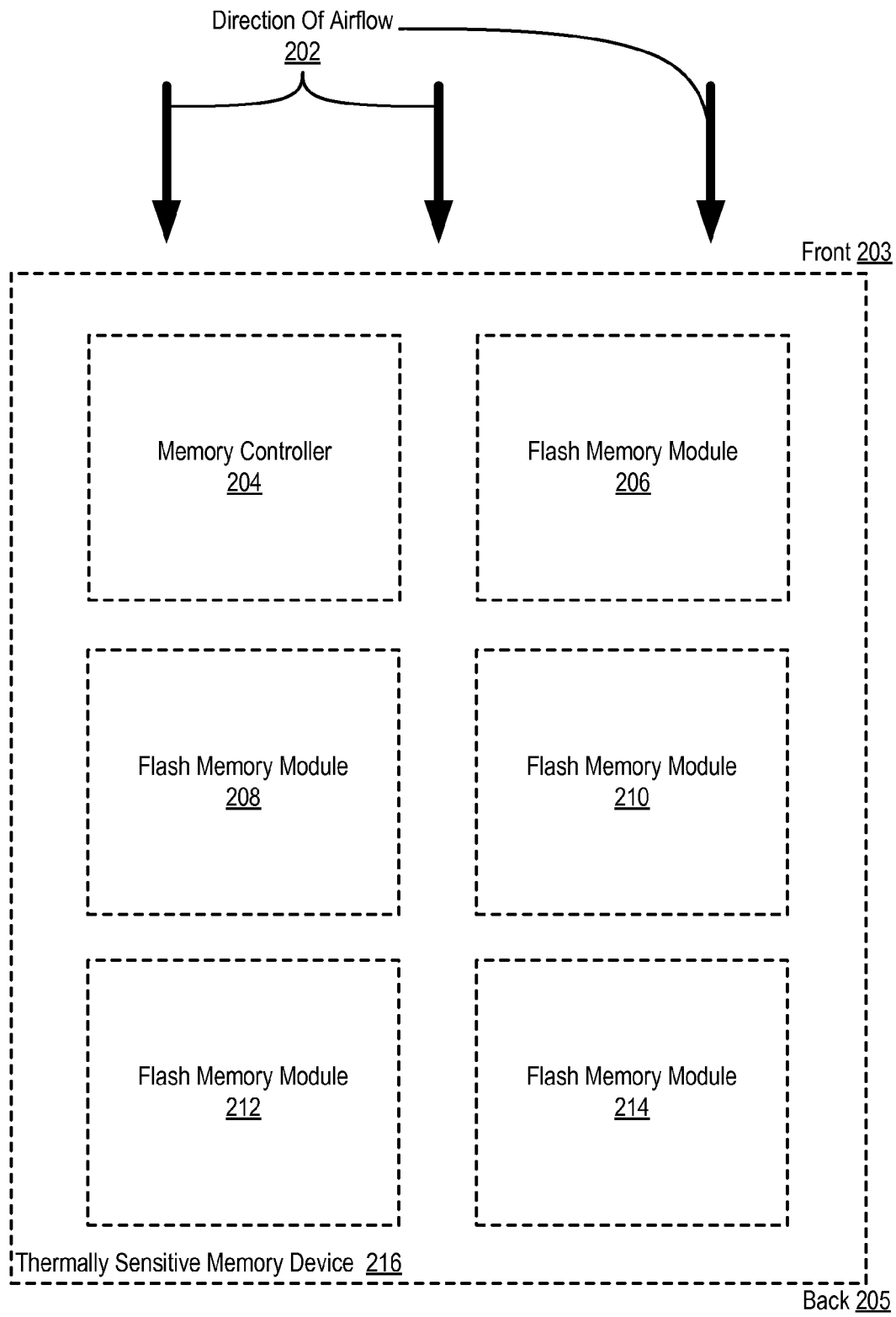
FIG. 2A sets forth a block diagram of a thermally sensitive memory device according to embodiments of the present invention.

For further explanation, FIG. 2A sets forth a block diagram of a thermally sensitive memory device (216) according to embodiments of the present invention. The thermally sensitive memory device (216) of FIG. 2A includes a plurality of flash memory modules (206, 208, 210, 212, 214). Flash memory is an electronic non-volatile computer storage device that can be electrically erased and reprogrammed. Because flash memory is an electronic storage device, flash memory does not include moving parts such as a read head and therefore offers relatively fast access. In the example method of FIG. 2A, each of the flash memory modules (206, 208, 210, 212, 214) may be embodied as a collection of flash memory cells. The flash memory modules (206, 208, 210, 212, 214) may be embodied, for example, as NAND flash memory that can be read from and written to in blocks or pages.

The thermally sensitive memory device (216) of FIG. 2A also includes a memory controller (204). The memory controller (204) of FIG. 2A may be embodied as a digital circuit that manages the flow of data going to and from the flash memory modules (206, 208, 210, 212, 214). The memory controller (204) may write data to the flash memory modules (206, 208, 210, 212, 214) and may also read data from the flash memory modules (206, 208, 210, 212, 214). Although not illustrated in FIG. 2A, a computing system that includes the thermally sensitive memory device (216) may also include cooling elements such as a fan for cooling components of the thermally sensitive memory device (216). Such a cooling element can generate airflow that passes over the thermally sensitive memory device (216) to remove heat from the thermally sensitive memory device (216).

In the example of FIG. 2A, the flash memory modules (206, 208, 210, 212, 214) and the memory controller (204) may each generate heat. The memory controller (204) can generate heat during normal operations, such as reading data from the flash memory modules (206, 208, 210, 212, 214) and writing data to the flash memory modules (206, 208, 210, 212, 214). The flash memory modules (206, 208, 210, 212, 214) themselves may also generate heat, especially when data is written to a particular flash memory module (206, 208, 210, 212, 214). In flash memory, a relatively large voltage is required to program memory cells in the flash memory modules (206, 208, 210, 212, 214). That is, a relatively large voltage is required to write data to the flash memory modules (206, 208, 210, 212, 214), when causes heat to be generated when writing data to the flash memory modules (206, 208, 210, 212, 214). Because heat causes a degradation in performance of flash memory, handling the heat generated by the memory controller (204) and by the flash memory modules (206, 208, 210, 212, 214) in an intelligent way can result in improved performance of the thermally sensitive memory device (216).

Consider an example in which the memory controller (204) is executing a sequence of write operations directed to flash memory module (206). In such an example, the operation of the memory controller (204) generates heat. Because the direction of airflow (202) in FIG. 2A is from the front (203) of the thermally sensitive memory device (216) to the back (205) of the thermally sensitive memory device (216), the heat generated by the memory controller (204) passes over flash memory module (208) and flash memory module (212). Likewise, heat generated by flash memory module (206) is passed over flash memory module (210) and flash memory module (212). In such an example, heat is introduced to flash memory modules (208, 210, 212, 214) that are not participating in the sequence of write operations directed to flash memory module (206), thereby causing a potential degradation in performance by flash memory modules (208, 210, 212, 214).

As an alternative to the memory controller (204) executing a sequence of write operations directed to flash memory module (206), consider an example in which the memory controller (204) is executing a sequence of write operations directed to flash memory module (214). In such an example, the heat generated by the memory controller (204) still passes over flash memory module (208) and flash memory module (212). The heat generated by flash memory module (214), however, does not pass over any of the other flash memory modules (206, 208, 210, 212) on the thermally sensitive memory device (216) and therefore does not negatively impact the performance of the other flash memory modules (206, 208, 210, 212). The examples described above illustrate that when a sequence of write operations is executed, directing the sequence of write operations to one flash memory module (208) can impact the performance of the thermally sensitive memory device (216) in a more significant way than if the sequence of write operations were directed to a different flash memory module (214). In general, the arrangement of elements on the thermally sensitive memory device (216) and the direction of airflow (202) across the memory device (216) can result in varying levels of thermal impact to components on the thermally sensitive memory device (216) when directing write operations to different flash memory modules (206, 208, 210, 212, 214) on the thermally sensitive memory device (216).

Figure 2B:
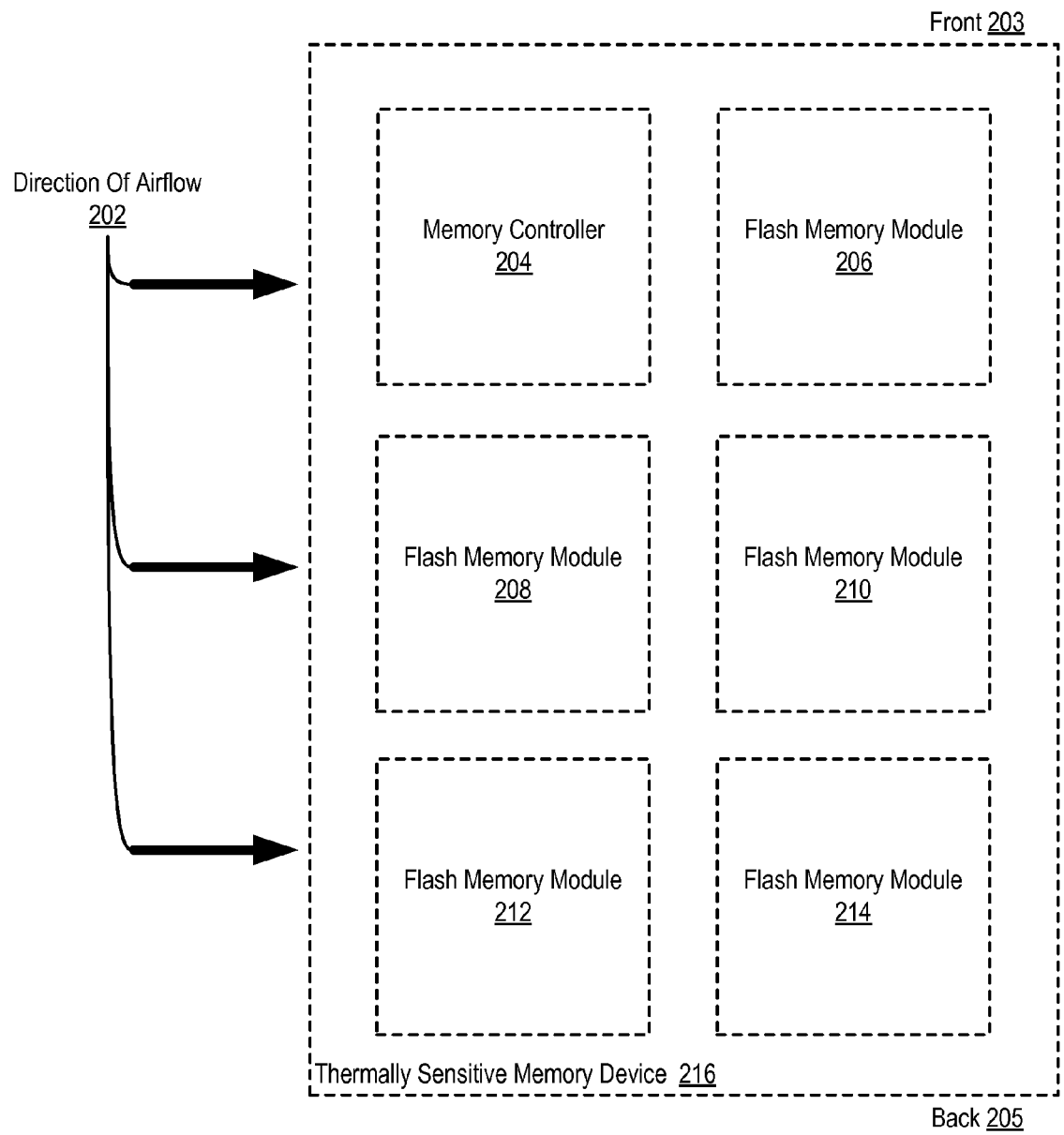
FIG. 2B sets forth a block diagram of a thermally sensitive memory device according to embodiments of the present invention.

For further explanation, FIG. 2B sets forth a block diagram of the thermally sensitive memory device (216) depicted in FIG. 2A. In the example of FIG. 2B, however, the direction of airflow (202) has been altered, thereby causing a change in the way a particular flash memory module (206, 208, 210, 212, 214) thermally impacts other flash memory modules (206, 208, 210, 212, 214).

Consider an example in which the memory controller (204) is executing a sequence of write operations directed to flash memory module (206). In such an example, the operation of the memory controller (204) generates heat. Because the direction of airflow (202) in FIG. 2B is parallel to the front (203) and the back (205) of the thermally sensitive memory device (216), the heat generated by the memory controller (204) passes over flash memory module (206). Heat generated by flash memory module (206), however, does not pass over any other components of the thermally sensitive memory device (216).

As an alternative to the memory controller (204) executing a sequence of write operations directed to flash memory module (206), consider an example in which the memory controller (204) is executing a sequence of write operations directed to flash memory module (208). In such an example, the heat generated by the memory controller (204) still passes over flash memory module (206). The heat generated by flash memory module (208) also passes over flash memory module (210) and therefore has a harmful thermal impact on flash memory module (210).

Figure 3:
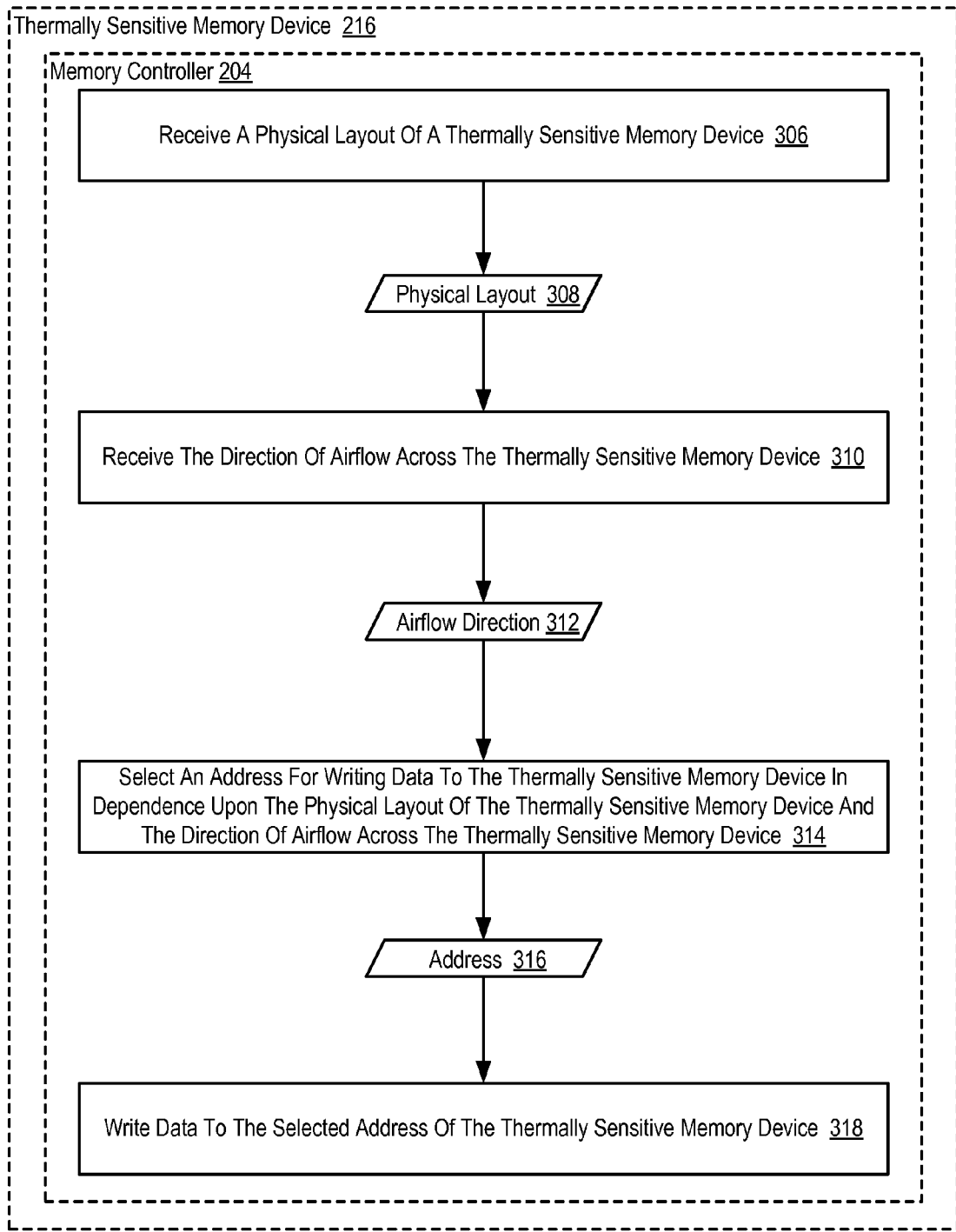
FIG. 3 sets forth a flow chart illustrating an example method for writing data to a thermally sensitive memory device according to embodiments of the present invention.

For further explanation, FIG. 3 sets forth a flow chart illustrating an example method for writing data to a thermally sensitive memory device (216) according to embodiments of the present invention. The example method of FIG. 3 includes receiving (306) a physical layout (308) of the thermally sensitive memory device (216). In the example method of FIG. 3, the physical layout (308) of the thermally sensitive memory device (216) may be embodied, for example, as a data structure that includes information identifying the coordinates of each component of the thermally sensitive memory device (216). In such an example, the memory controller (204) can receive (306) the physical layout (308) of the thermally sensitive memory device (216), for example, by receiving such information from a system administrator, by having such information programmed into memory of the memory controller (204), by receiving such information from a system management module, and so on.

The example method of FIG. 3 also includes receiving (310) the direction (312) of airflow across the thermally sensitive memory device (216). In the example method of FIG. 3, the direction (312) of airflow across the thermally sensitive memory device (216) may be specified, for example, as an angle of entry relative to a fixed point on the thermally sensitive memory device (216). For example, the direction (312) of airflow illustrated in FIG. 2A may be specified as being at a 90 degree angle relative to the plane that defines the front (203 in FIG. 2A) of the thermally sensitive memory device (216). In such an example, if the direction of airflow were rotated 180 degrees, the direction (312) of airflow illustrated in FIG. 2A may be specified as being at a 270 degree angle relative to the plane that defines the front (203 in FIG. 2A) of the thermally sensitive memory device (216). Likewise, the direction (312) of airflow illustrated in FIG. 2B may be specified as being at a 0 degree angle relative to the plane that defines the front (203 in FIG. 2B) of the thermally sensitive memory device (216). In such an example, if the direction of airflow were rotated 180 degrees, the direction (312) of airflow illustrated in FIG. 2B may be specified as being at a 180 degree angle relative to the plane that defines the front (203 in FIG. 2B) of the thermally sensitive memory device (216).

The example method of FIG. 3 also includes selecting (314) an address for writing data to the thermally sensitive memory device (216) in dependence upon the physical layout (308) of the thermally sensitive memory device (216) and the direction (312) of airflow across the thermally sensitive memory device (216). In the example method of FIG. 3, selecting (314) an address for writing data to the thermally sensitive memory device (216) may be carried out by identifying a particular flash memory module that has the least thermal impact on other flash memory modules in the thermally sensitive memory device (216). The flash memory module that has the least thermal impact on other flash memory modules in the thermally sensitive memory device (216) may be identified in dependence upon the physical layout (308) of the thermally sensitive memory device (216) and the direction (312) of airflow across the thermally sensitive memory device (216). In such an example, once the flash memory module has identified the flash memory module that has the least thermal impact on other flash memory modules, a free address in the identified flash memory module can be identified and selected (314).

Consider the example depicted in FIG. 2A. In such an example, flash memory module (212) and flash memory module (214) may be identified as the flash memory modules (212, 214) that have the least thermal impact on other flash memory modules (206, 208, 210) in the thermally sensitive memory device (216). As such, the memory controller (204) can identify free memory in either flash memory module (212, 214) and select an address from the free memory as the address for writing data to the thermally sensitive memory device (216).

The example method of FIG. 3 also includes writing (318) data to the selected address (316) of the thermally sensitive memory device (216). In the example method of FIG. 3, writing (318) data to the selected address (316) of the thermally sensitive memory device (216) may be carried out, for example, by committing the data to memory cells in a flash memory module that corresponds to the selected address (316) of the thermally sensitive memory device (216).

In the example described above in FIG. 3, the memory controller (204) carries out the steps of receiving (306) a physical layout (308) of the thermally sensitive memory device, receiving (310) the direction (312) of airflow across the thermally sensitive memory device, and selecting (314) an address for writing data to the thermally sensitive memory device in dependence upon the physical layout (308) of the thermally sensitive memory device and the direction (312) of airflow across the thermally sensitive memory device. Readers will appreciate, however, that the memory controller (204) performing these steps is only described as one possible embodiment and is not a limitation of the present invention. In fact, all of these steps may be performed by a module of computer program instructions that does not reside on the memory controller (204). For example, the write management module (126 of FIG. 1) described above may receive (306) a physical layout (308) of the thermally sensitive memory device and also receive (310) the direction (312) of airflow across the thermally sensitive memory device. The write management module (126 of FIG. 1) may subsequently generate tables and other data structures that are loaded onto the memory controller (204) to enable the memory controller (204) to select (314) an address for writing data to the thermally sensitive memory device in dependence upon the physical layout (308) of the thermally sensitive memory device and the direction (312) of airflow across the thermally sensitive memory device and to write (318) data to the selected address (316) of the thermally sensitive memory device.

Figure 4:
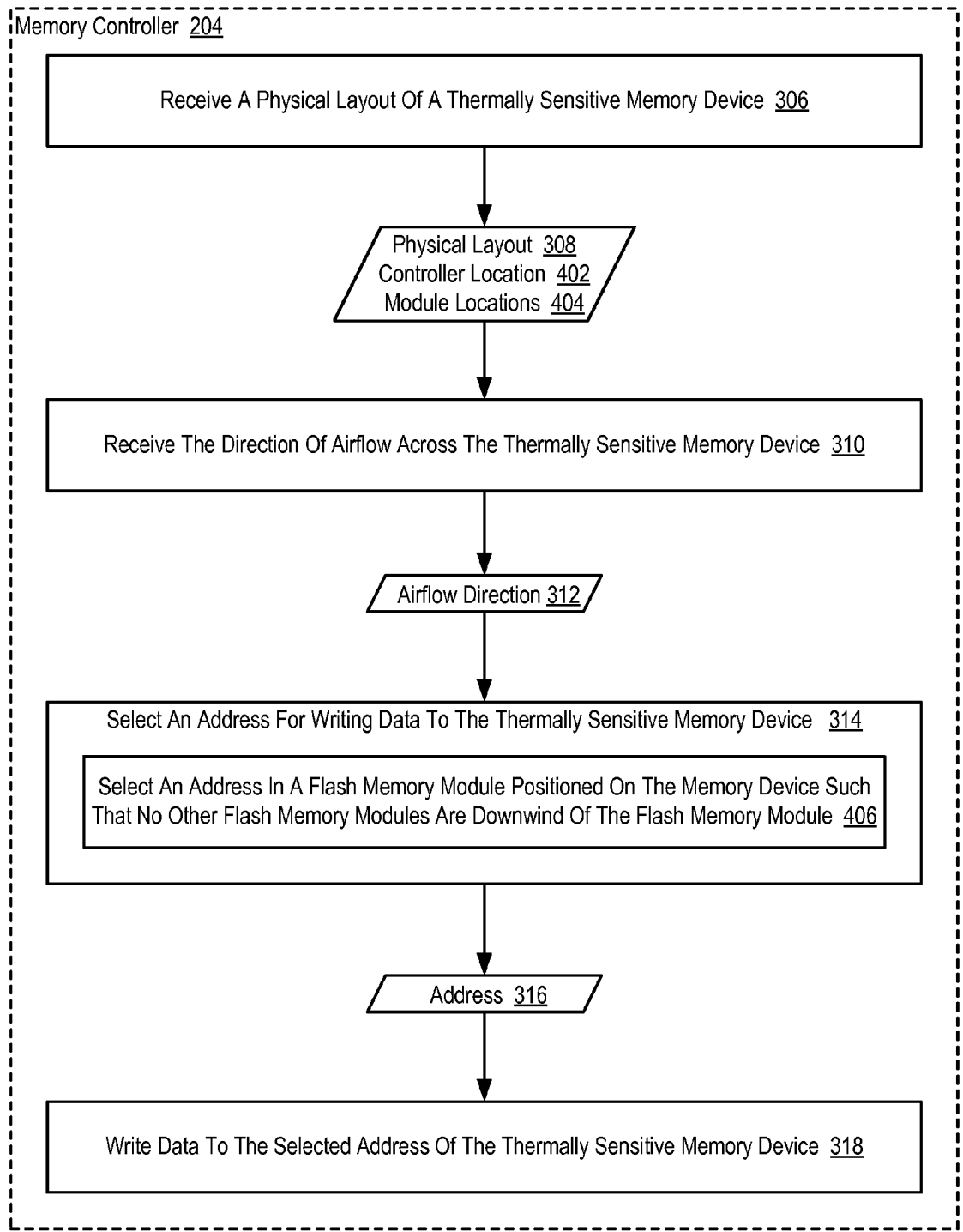
FIG. 4 sets forth a flow chart illustrating an additional example method for writing data to a thermally sensitive memory device according to embodiments of the present invention.

For further explanation, FIG. 4 sets forth a flow chart illustrating an additional example method for writing data to a thermally sensitive memory device according to embodiments of the present invention. The example method of FIG. 4 is similar to the example method of FIG. 3 as it also includes receiving (306) a physical layout (308) of the thermally sensitive memory device, receiving (310) the direction (312) of airflow across the thermally sensitive memory device, selecting (314) an address for writing data to the thermally sensitive memory device in dependence upon the physical layout (308) of the thermally sensitive memory device and the direction (312) of airflow across the thermally sensitive memory device, and writing (318) data to the selected address (316) of the thermally sensitive memory device.

In the example method of FIG. 4, the physical layout (308) of the thermally sensitive memory device identifies the location (404) of flash memory modules on the thermally sensitive memory device. In the example method of FIG. 4, the location (404) of flash memory modules on the thermally sensitive memory device may be specified, for example, by a set or coordinates that identifies the location of each corner of a particular flash memory module, by an angle to the center point of a particular flash memory module relative to a fixed location, by an angle to the center point of a particular flash memory module relative to the center point of the memory controller (204), and in other ways as will occur to those of skill in the art.

In the example method of FIG. 4, the physical layout (308) of the thermally sensitive memory device identifies the location (402) of the memory controller (204) on the thermally sensitive memory device. In the example method of FIG. 4, the location (402) of the memory controller (204) on the thermally sensitive memory device may be specified, for example, by a set or coordinates that identifies the location of each corner of the memory controller (204), by an angle to the center point of the memory controller (204) relative to a fixed location, by an angle to the center point of the memory controller (204) relative to the center point of a particular flash memory module, and in other ways as will occur to those of skill in the art.

In the example method of FIG. 4, selecting (314) an address for writing data to the thermally sensitive memory device can include selecting (406) an address in a flash memory module positioned on the memory device such that no other flash memory modules are downwind of the flash memory module. In the example method of FIG. 4, selecting (406) an address in a flash memory module positioned on the memory device such that no other flash memory modules are downwind of the flash memory module may be carried out, for example, through the use of a memory module selection table set forth below:

TABLE 1

Memory Module Selection Table

| Memory Module | Downwind Modules |
|---|---|
| 206 | 210, 214 |
| 208 | 212 |
| 210 | 214 |
| 212 | None |
| 214 | None |

Table 1 depicts a memory module selection table for the thermally sensitive memory device (216) depicted in FIG. 2A. The memory module selection table includes an entry for each of the flash memory modules (206, 208, 210, 212, 214 of FIG. 2A). Each entry also includes an identification of the flash memory modules that are downwind from a particular flash memory module, thereby identifying the flash memory modules that would be thermally impacted if the particular flash memory module was targeted by one or more write operations. In such an example, selecting (406) an address in a flash memory module positioned on the memory device such that no other flash memory modules are downwind of the flash memory module may be carried out by selecting an address within a flash memory module that has no other downwind modules.

In the example method of FIG. 4, the memory module selection table may be generated by a module of computer program instructions that does not reside on the memory controller (204). For example, the memory module selection table may be generated by a write management module (126 of FIG. 1) described above and loaded into memory of the memory controller (204) for use by the memory controller (204).

Figure 5:
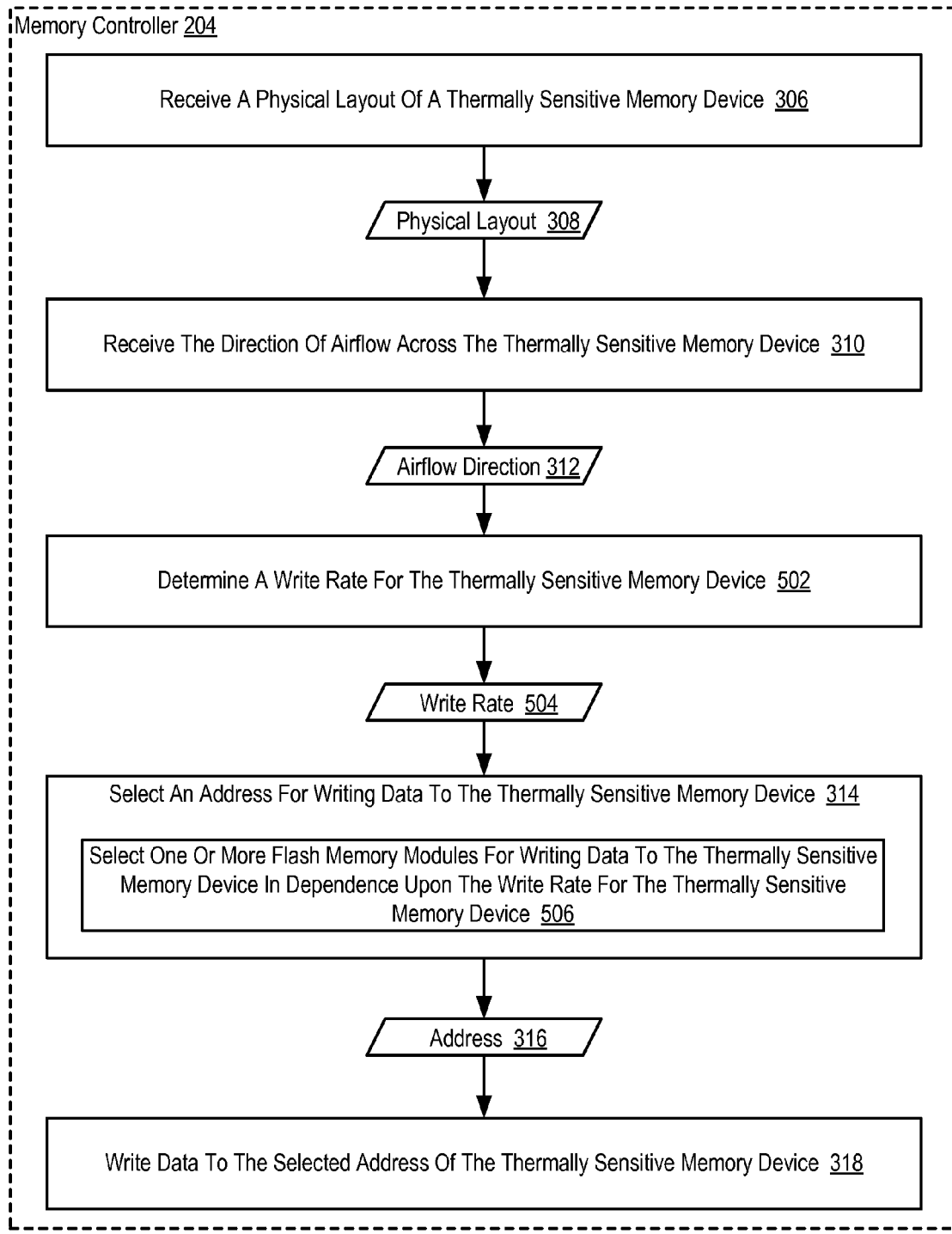
FIG. 5 sets forth a flow chart illustrating an additional example method for writing data to a thermally sensitive memory device according to embodiments of the present invention.

For further explanation, FIG. 5 sets forth a flow chart illustrating an additional example method for writing data to a thermally sensitive memory device according to embodiments of the present invention. The example method of FIG. 5 is similar to the example method of FIG. 3 as it also includes receiving (306) a physical layout (308) of the thermally sensitive memory device, receiving (310) the direction (312) of airflow across the thermally sensitive memory device, selecting (314) an address for writing data to the thermally sensitive memory device in dependence upon the physical layout (308) of the thermally sensitive memory device and the direction (312) of airflow across the thermally sensitive memory device, and writing (318) data to the selected address (316) of the thermally sensitive memory device.

The example method of FIG. 5 also includes determining (502) a write rate (504) for the thermally sensitive memory device. In the example method of FIG. 5, the write rate (504) represents the number of write instructions that the thermally sensitive memory device executes in a predetermined period of time. The write rate (504) therefore represents an indication of the amount of heat that all computing elements in the thermally sensitive memory device are producing in a predetermined period of time. That is, a high write rate (504) would indicate that the thermally sensitive memory device is producing a relatively large amount of heat while a low write rate (504) would indicate that the thermally sensitive memory device is producing a relatively small amount of heat.

In the example method of FIG. 5, selecting (314) an address for writing data to the thermally sensitive memory device can include selecting (506) one or more flash memory modules for writing data to the thermally sensitive memory device in dependence upon the write rate (504) for the thermally sensitive memory device. In the example method of FIG. 5, when the write rate (504) is low the memory controller (204) can direct a higher portion of write operations to the memory modules that thermally impact other memory modules on the thermally sensitive memory device. The memory controller (204) can direct a higher portion of write operations to the memory modules that thermally impact other memory modules in the thermally sensitive memory device because the relatively low number of write operations, as indicated by the write rate (504), will limit the thermal impact on other memory modules in the thermally sensitive memory device. When the write rate (504) is high, however, the memory controller (204) can direct a higher portion of write operations to the memory modules that do not thermally impact other memory modules on the thermally sensitive memory device. The memory controller (204) can direct a higher portion of write operations to the memory modules that do not thermally impact other memory modules in the thermally sensitive memory device because the relatively high number of write operations, as indicated by the write rate (504), will significantly impact any downwind memory modules in the thermally sensitive memory device.

Consider the example thermally sensitive memory device (216 of FIG. 2A) depicted in FIG. 2A. In such an example, when the write rate (504) is low, the memory controller (204 of FIG. 2A) could direct write operations to flash memory modules (206, 208, 210 in FIG. 2A) that thermally impact other flash memory modules (212, 214 in FIG. 2A) in the thermally sensitive memory device (216 of FIG. 2A). When the write rate (504) is high, however, directing write operations to flash memory modules (206, 208, 210 in FIG. 2A) would have a more significant thermal impact on the other flash memory modules (212, 214 in FIG. 2A) in the thermally sensitive memory device (216 of FIG. 2A). As such, during bursts of write operations the memory controller (204 of FIG. 2A) can direct the write operations to the flash memory modules (212, 214 in FIG. 2A) that do not thermally impact any other flash memory modules (206, 208, 210 in FIG. 2A) so that the relatively large amount of heat generated will be removed from the thermally sensitive memory device (216 of FIG. 2A) with minimal impact on the computing components in the thermally sensitive memory device (216 of FIG. 2A).

In the example method of FIG. 5, selecting (506) one or more flash memory modules for writing data to the thermally sensitive memory device in dependence upon the write rate (504) for the thermally sensitive memory device may be carried out, for example, through the use of a rate dependent memory module selection table as set forth below:

TABLE 2

Rate Dependent Memory Module Selection Table

| Write Rate | Candidate Modules |
|---|---|
| 0-10 | 206 |
| 10-20 | 208, 210 |
| 20+ | 212, 214 |

Table 2 depicts a rate dependent memory module selection table for the thermally sensitive memory device (216) depicted in FIG. 2A. As illustrated in the table, when the write rate (504) is extremely low, the flash memory module (206 in FIG. 2A) that thermally impacts the highest number of flash memory modules (210, 214 in FIG. 2A) is selected for writing data. As the write rate (504) increases, flash memory modules that impact a lower number of flash memory modules are selected for writing data.

In the example method of FIG. 5, the rate dependent memory module selection table may be generated by a module of computer program instructions that does not reside on the memory controller (204). For example, the rate dependent memory module selection table may be generated by a write management module (126 of FIG. 1) described above and loaded into memory of the memory controller (204) for use by the memory controller (204).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. An apparatus for writing data to a thermally sensitive memory device, the apparatus comprising a computer processor, a computer memory operatively coupled to the computer processor, the computer memory having disposed within it computer program instructions that, when executed by the computer processor, cause the apparatus to carry out the steps of:
   receiving a physical layout of the thermally sensitive memory device; wherein the thermally sensitive memory device includes a plurality of memory modules;
   receiving the direction of airflow across the thermally sensitive memory device;
   selecting an address for writing data to the thermally sensitive memory device in dependence upon the physical layout of the thermally sensitive memory device and the direction of airflow across the thermally sensitive memory device including selecting from the plurality of memory modules of the thermally sensitive memory device, a particular memory module that is downwind of all of the other memory modules in the plurality of memory modules; and
   writing data to the selected address of the thermally sensitive memory device.

2. The apparatus of claim 1 wherein the physical layout of the thermally sensitive memory device identifies the location of flash memory modules on the thermally sensitive memory device.

3. The apparatus of claim 1 wherein the physical layout of the thermally sensitive memory device identifies the location of a memory controller on the thermally sensitive memory device.

4. The apparatus of claim 1 further comprising computer program instructions that, when executed by the computer processor, cause the apparatus to carry out the step of:
   determining a write rate for the thermally sensitive memory device; and
   wherein selecting an address for writing data to the thermally sensitive memory device in dependence upon the physical layout of the thermally sensitive memory device and the direction of airflow across the thermally sensitive memory device includes selecting one or more flash memory modules for writing data to the thermally sensitive memory device in dependence upon the write rate for the thermally sensitive memory device.

5. The apparatus of claim 1 wherein the thermally sensitive memory device includes flash memory.

6. A computer program product for writing data to a thermally sensitive memory device, the computer program product disposed upon a computer readable medium, the computer program product comprising computer program instructions that, when executed, cause a computer to carry out the steps of:
   receiving a physical layout of the thermally sensitive memory device; wherein the thermally sensitive memory device includes a plurality of memory modules;
   receiving the direction of airflow across the thermally sensitive memory device;
   selecting an address for writing data to the thermally sensitive memory device in dependence upon the physical layout of the thermally sensitive memory device and the direction of airflow across the thermally sensitive memory device including selecting from the plurality of memory modules of the thermally sensitive memory device, a particular memory module that is downwind of all of the other memory modules in the plurality of memory modules; and writing data to the selected address of the thermally sensitive memory device.

7. The computer program product of claim 6 wherein the physical layout of the thermally sensitive memory device identifies the location of flash memory modules on the thermally sensitive memory device.

8. The computer program product of claim 6 wherein the physical layout of the thermally sensitive memory device identifies the location of a memory controller on the thermally sensitive memory device.

9. The computer program product of claim 6 further comprising computer program instructions that, when executed, cause the computer to carry out the step of:
   determining a write rate for the thermally sensitive memory device; and
   wherein selecting an address for writing data to the thermally sensitive memory device in dependence upon the physical layout of the thermally sensitive memory device and the direction of airflow across the thermally sensitive memory device includes selecting one or more flash memory modules for writing data to the thermally sensitive memory device in dependence upon the write rate for the thermally sensitive memory device.

10. The computer program product of claim 6 wherein the thermally sensitive memory device includes flash memory.

11. The computer program product of claim 6 wherein the computer readable medium comprises a signal medium.

12. The computer program product of claim 6 wherein the computer readable medium comprises a storage medium.

* * * * *